United States Patent [19]
Grant

[11] Patent Number: 5,625,249
[45] Date of Patent: Apr. 29, 1997

[54] MEGASONIC CLEANING SYSTEM

[75] Inventor: Robert Grant, Allentown, Pa.

[73] Assignee: SubMicron Systems, Inc., Allentown, Pa.

[21] Appl. No.: 277,792

[22] Filed: Jul. 20, 1994

[51] Int. Cl.⁶ .................................................. H01L 41/08
[52] U.S. Cl. .......................... 310/334; 310/317; 134/147; 134/184
[58] Field of Search ................................ 310/328, 317, 310/334; 134/1, 134, 147, 184

[56] References Cited

U.S. PATENT DOCUMENTS

| | | | |
|---|---|---|---|
| 1,734,975 | 11/1929 | Loomis et al. | 310/328 |
| 2,468,538 | 4/1949 | Benioff | 259/1 |
| 2,760,501 | 8/1956 | Gander | 310/317 |
| 3,113,761 | 12/1963 | Platzman | 310/334 |
| 3,441,754 | 4/1969 | Heny | 310/334 |
| 3,520,724 | 7/1970 | Massa | 310/328 |
| 3,535,159 | 10/1970 | Shiro | 134/1 |
| 3,771,772 | 11/1973 | Honda | 310/334 |
| 3,821,834 | 7/1974 | McElroy | 310/334 |
| 4,057,070 | 11/1977 | Van Amerongen et al. | 134/83 |
| 4,391,672 | 7/1983 | Lehtinen | 162/192 |
| 4,434,384 | 2/1984 | Dunnrowicz et al. | 310/325 |
| 4,543,130 | 9/1985 | Schwartzman | 134/1 |
| 4,602,184 | 7/1986 | Meitzler | 310/322 |
| 4,763,677 | 8/1988 | Miller | 134/105 |
| 4,804,007 | 2/1989 | Bran | 134/184 |
| 4,836,684 | 6/1989 | Javorik et al. | 134/1 |
| 5,003,999 | 4/1991 | Cardani et al. | 134/105 |
| 5,054,210 | 10/1991 | Schumacher et al. | 34/28 |
| 5,137,580 | 8/1992 | Honda | 134/1 |
| 5,221,421 | 6/1993 | Leibovitz et al. | 156/642 |
| 5,355,048 | 10/1994 | Estes | 310/334 |

FOREIGN PATENT DOCUMENTS 7406080  11/1975  Netherlands .................. 134/1

*Primary Examiner*—Thomas M. Dougherty
*Attorney, Agent, or Firm*—Cobrin Gittes & Samuel

[57] ABSTRACT

A megasonic cleaning system utilizes a transducer positioned outside of a cleaning tank to transmit acoustical energy into the cleaning tank. A liquid layer is used to couple the acoustical energy from the transducer to the cleaning tank. An acoustical impedance matching layer, having an acoustical impedance in between that of the transducer and the cleaning fluid, is used to match the impedance of the transducer to that of the cleaning fluid. In one embodiment, the system utilizes at least two transducer arrays and power is switched back and forth between the two arrays. When one array is not being powered, it can be used to listen to the other array.

10 Claims, 4 Drawing Sheets

MEGASONIC CLEANING SYSTEM

BACKGROUND OF THE INVENTION

The present invention relates to megasonic cleaning systems for cleaning semiconductor wafers and other items which require the removal of extremely small particles. Such systems are generally comprised of a tank, for holding cleaning fluid and articles to be cleaned, and piezo electric transducers for transmitting acoustic energy at a frequency of approximately 1000 kilohertz into the cleaning tank. Typically, the transducers are mounted either in the interior of the tank or on the exterior of the tank. A disadvantage of these arrangements is that they do not allow a set of transducers to be easily used in conjunction with a number of different cleaning tanks.

A further disadvantage of the prior megasonic cleaning systems is that they do not provide high levels of acoustical impedance matching between the transducers and the cleaning fluid. This does not allow for maximum energy transfer between the transducers and the cleaning liquid. In this regard, it is noted that U.S. patent application Ser. No. 08/139,981, filed Sep. 28, 1993, (hereinafter "the '981 application"), of which the inventor of the present application is a coinventor, discloses the use of a transducer mounted in a quartz tube which is in turn mounted inside a cleaning tank. The quartz tube is a quarter wavelength thick and acts as an impedance matching layer between the transducer and the cleaning fluid in the tank. Quartz, however, is not an optimal impedance matching layer. The invention disclosed in the '981 application, because it has been on sale for more than a year, is prior art to the invention of the present application. The disclosure of the '981 application is hereby incorporated in the present application by reference.

A still further disadvantage of the prior art is that it does not provide a method for monitoring the operation of the transducers.

SUMMARY OF THE INVENTION

There is provided, in accordance with the present invention, an improved megasonic cleaning system which does not possess the shortcomings of the prior art and offers the advantages of allowing a plurality of cleaning tanks to be used interchangeably with one group of transducers, of providing effective impedance matching between the transducers and the tank and of monitoring the operation of the transducers.

A further advantage of the present invention is that it can provide a megasonic cleaning system wherein a RF power supply normally used to power a single transducer array can be used to power at least two such arrays.

Theses and other objects of the present invention are provided by a megasonic cleaning system which in one embodiment utilizes a liquid layer to couple acoustic energy from transducers positioned outside of the cleaning tank to the cleaning tank itself. A dedicated impedance matching layer can be coupled to the transducers to match the impedance of the transducers to that of the cleaning fluid. In one embodiment, the megasonic cleaning system may be comprised of two separate arrays which are alternately powered by the same power supply. This allows a single power supply to be utilized where normally two would be needed. In a further aspect of this invention, the each transducer array, when it is not being powered, can be used to listen to the other array. This provides an economical and effective method of monitoring the performance of both arrays.

These and other aspects of the invention will become apparent from the attached drawings and the following description.

DESCRIPTION OF THE PREFERRED EMBODIMENTS

Figure 2:
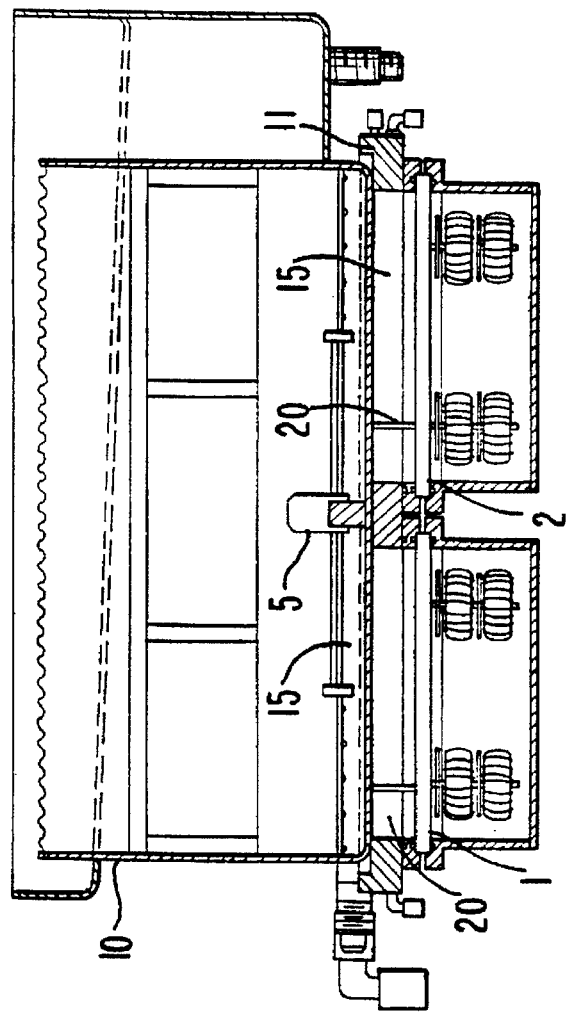
FIG. 2 is a sectional side view of the FIG. 1 megasonic cleaning system.
Figure 1:
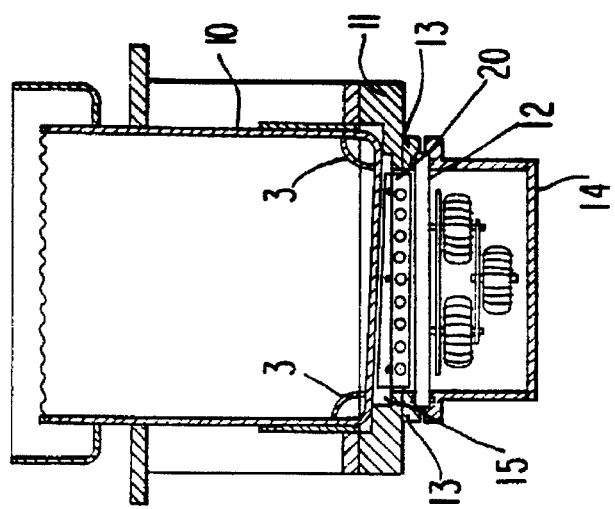
FIG. 1 is a sectional end view of a megasonic cleaning system according to the present invention.
Figure 3A:
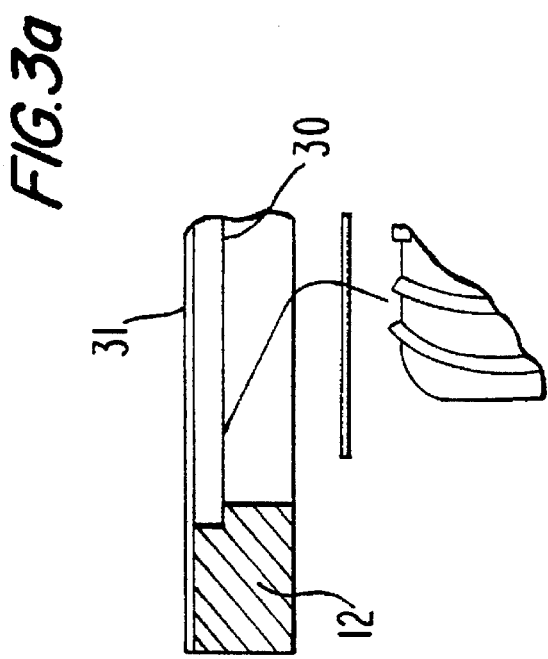
FIG. 3a is enlarged view of a section of FIG. 3 showing the impedance matching layer.
Figure 3:
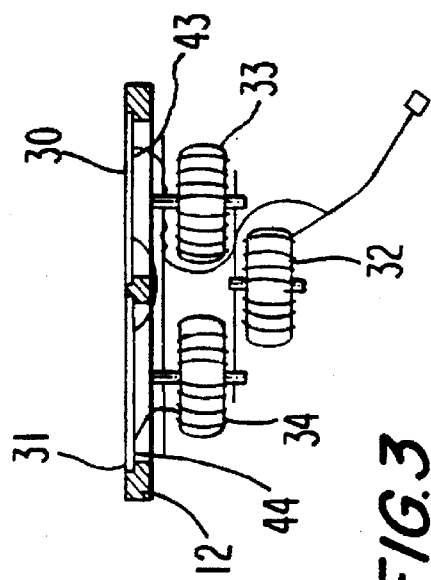
FIG. 3 is an end view of a transducer array used in the FIG. 1 megasonic cleaning system.

FIGS. 1 & 2 shows a megasonic cleaning system in accordance with the present invention. It has a quartz cleaning tank 10 which removeably mounted on a tank frame 11. The tank can be filled with any appropriate cleaning fluid and the tank is typically made of quartz. Positioned below the tank are two transducer arrays 1 & 2. As is shown in FIGS. 3 and 3a, an acoustical impedance matching layer is coupled to the top of the transducers in the transducer arrays and serves to match the acoustical impedance of the transducers to that of the cleaning fluid. Referring back to FIGS. 1 and 2, a cavity 15, filled with liquid, acoustically couples the top of the matching layer to the bottom of the tank 10. This method of liquid coupling allows for the tank to be easily separated from the transducer arrays so that other tanks can be used with them as well. Hydraulically actuated wipers 20 positioned in the cavities 15 are used to wipe away bubbles from the top surface of the matching layer and from the bottom surface to the cleaning tank 10.

In operation, RF frequency electrical energy is provided to the transducers at approximately 950 kilohertz. In a preferred embodiment the RF frequency electrical energy is alternately applied to one array and then to the other with the switching occurring at a rate of 10 to 20 time per second. In this way, a single RF amplifier of approximately 1000 watts, can be used to power both arrays. In addition, the array that is not broadcasting can be used to listen to the array which is. In this way the proper operation of both arrays can be monitored.

Referring back to FIG. 1 it can be seen that coupled to the underside of the tank frame 11 is a removable box 14. Box 14 includes transducer frame 12 for holding an array of megasonic transducers and an impedance matching layer. Also enclosed in the box are transformers which match the electrical impedance of the power supply to that of the transducers. Gasket 13 seals the box against the bottom of tank frame 11. Cavity 15 is formed between transducer frame 12, the tank frame 11 and the bottom of the cleaning tank 10. Cavity 15 is preferably filled with deionized water which serves to couple megasonic acoustic energy produced by the transducers to the tank 10 and into the cleaning fluid in the tank.

As seen in FIG. 2, the megasonic cleaning system has of two arrays of megasonic transducers housed in two separate removable boxes. The boxes are mechanically attached to the tank frame 11 and can be removed as units therefrom. Situated in the cavity 15 above each box are the wipers 20 which serve to wipe bubbles of the bottom of the tank 10 and the top of the matching layer which is formed on top of the transducers. The bubbles form on these surfaces because of cavitation caused by the operation of the megasonic transducers. A hydraulically operated piston is used to move the wipers across the aforementioned surfaces every 10 to 15 minutes.

FIG. 3 shows a sectional view of a transducer frame 12. As shown in the enlarged FIG. 3a, the frame 12 supports transducers 30 which typically are ceramic piezo electric crystals. The frame 12 is made of PEEK plastic which has low thermal expansion characteristics. Coupled to the top of the transducers 30 and the frame 12 is an impedance matching layer 31. As previously indicated, the impedance matching layer has an impedance in between that of the transducers and that of the cleaning fluid. Ideally the impedance of the matching layer has a thickness equivalent to an odd multiple of the quarter wavelength of the acoustic energy in the matching layer. Further, the matching layer ideally has an acoustic impedance (Zm) which is the geometric mean of the impedance of the transducer (Zt) and the impedance of the cleaning fluid (Zc). Thus the ideal impedance of the matching layer is given by the equation Zm=□ (Zt*Zc).

Figure 4:
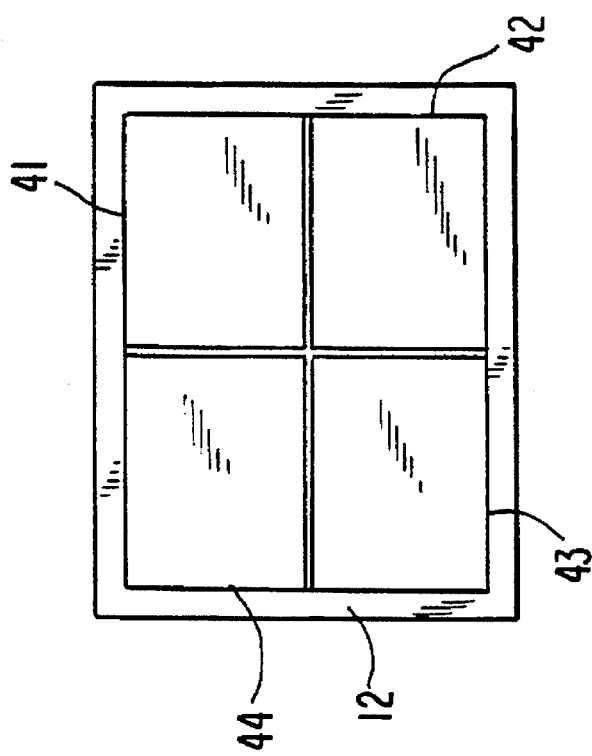
FIG. 4 is a top view of a mounting frame holding four piezo electric transducers and is shown without the impedance matching layer.

FIG. 4 shows a top view of a transducer array of a megasonic cleaning system in accordance with the present invention. It has four separate megasonic transducers 41, 42, 43 & 44. The four transducers of each array are divided into two sets of two transducers each. Each set of two transducer is supplied with power from a group of three transformers as shown in FIG. 3. This provides a two-stage electrical impedance matching arrangement. In the first stage, transformer 32 cuts the impedance of the power supply from approximately 50 Ohms to approximately 10 Ohms. In the second stage, transformers 33 & 34 cut the impedance to 3–4 Ohms depending upon the characteristics of the individual transducers 43 & 44. Thus when each transducer array is built, the second stage transformers are individually selected to match the impedance of the supplied power to the individual transducers which are used. Because 3 transformers are used in conjunction with every two transducers, each array utilizes a total of six transformers and the total system, comprised of two arrays, uses a total of 12 transformers.

Figure 5:
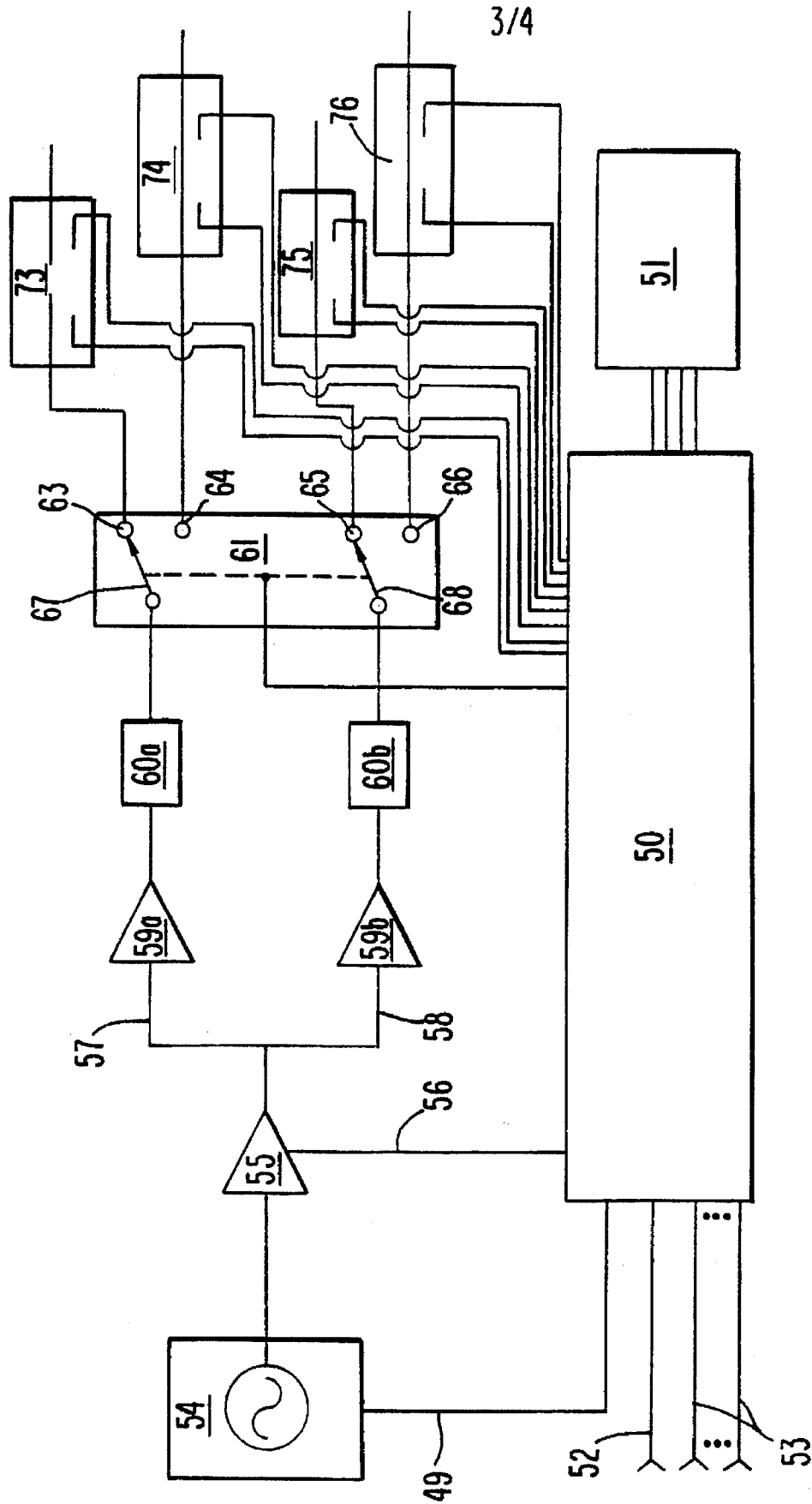
FIG. 5 is a circuit diagram of the system used to drive the transducers of the FIG. 1 megasonic cleaning system.

FIG. 5 shows the power supply circuitry for the transducers. A controller 50 such as an Intel 8087 chip can be used to control the supply of power to the transducers. Controller 50 can be controlled by front panel unit 51 and it can also be controlled by computer via RS232 line 52 and by dry closure lines 53. The dry closure lines can be used to command simple operations such as cutting off power if there is not enough cleaning liquid in the tank, insuring the temperature in the tank is appropriate and actuating the wipers.

The controller 50, via channel 49, indicates the desired frequency of operation of the transducers to the direct digital synthesizer 54 which in turn provides a signal at the correct frequency to RF amplifier 55. RF amplifier 55 which is a nominally 1000 watt power supply, supplies approximately 950 watts at the desired frequency, approximately 950 kilohertz, from two separate channels which provide 450–500 watts each. A suitable RF amplifier is available from Advanced Analog Devices of San Jose, Calif.

The amplitude of the signal produced by RF amplifier 55 is regulated by controller 50 via automatic level control channel 56. The output of RF amplifier 55 is split between two separate channels 57 and 58 which have amplifiers 59a and 59b for fine tuning the amplitude of the signal provided RF amplifier 55. RF filters 60a and 60b serve to filter out any harmonics frequencies which might be generated by the system. The output signals from RF filters 60a and 60b are provided to electronic switching device 61 which is regulated by controller 50 via 62. The electronic switch 61 switches the output of channels 57 and 58 between two separate output lines. Thus the output of channel 57 can be provided to either 63 or 64 while the output of channel 58 can be provided to either 65 or 66. The individual switches 67 and 68 of switching device 61 operate in tandem so that power is either supplied to 63 and 65 or to 64 and 66. In this way, if the RF outputs of 63 and 65 are provided respectively to the two sets of transducers of one transducer array while the RF outputs of 64 and 66 are provided respectively to the two sets of transducers of the other transducer array, it can be seen that approximately 950 watts of power can alternately be supplied to each array.

Controller 50 commands the electronic switch device to switch between supplying one transducer array and the other at a rate of approximately 10 to 20 times per second. Thus while one array is broadcasting the other array is silent. In this way, a single power source can be used to supply to separate transducer arrays. Because of the significant cost of RF amplifiers, this provides a cost savings which is an important advantage of the present device. In addition, it allows the performance of each array of transducers to be monitored.

Shown on output lines 63–66 respectively are detectors 73–76 respectively which are monitored by controller 50. Because piezo electric transducers not only vibrate in response to electrical signals but also generate electrical signals in response to pressure signals, the detectors associated with the nonbroadcasting array can be used to detect the acoustic energy produced by the broadcasting array. Thus each array can be used to monitor the performance of the other by monitoring the signal from the nonbroadcasting array with the appropriate detectors and controller 50.

Another advantage of switching the power between the two arrays is that it prevents the establishment of standing waves. Waves reflecting off of the top surface of the cleaning liquid can constructively and destructively interfere with the waves entering through the bottom of the tank to form nodes or standing waves. This is harmful since it mitigates the uniformity of the cleaning power which is applied to the articles to be cleaned.

Returning to FIG. 1, it can be seen that the bottom of tank 10 is angled at approximately 2 degrees with respect to level. This aids in preventing the build up of bubbles on the bottom surface of the tank by encouraging the bubbles to float upwards along the bottom of the tank. The bottom of the cleaning tank 10 is precision machined to an even thickness. The even thickness of the bottom of the tank ensures that the acoustic energy passes through the bottom of the tank evenly without there being any dead spots. The thickness of the bottom of the tank should be equivalent to an even multiple of the half wavelength of the megasonic energy in the tank. In this way, the bottom of the tank acts as a narrow bandpass filter for allowing through the acoustic energy provided by the transducers. In a preferred embodiment, the bottom of the tank has a thickness of 2 half wavelengths, i.e. 1 full wavelength, which is approximately 0.233 inches for quartz.

In order to make sure that the megasonic cleaning system works efficiently, each tank is individually examined to determine the exact frequency of acoustic energy which will pass through it most efficiently. The power supply system can then be tuned accordingly.

As shown in FIG. 1, the tank also includes corner injection manifolds 3, welded to the corner of the tank, which are perforated and are used to inject cleaning fluid into the tank. As shown in FIG. 2, the tank can also have a small product furniture 5 which can be used to support industry standard semiconductor wafer cassettes.

Figure 7:
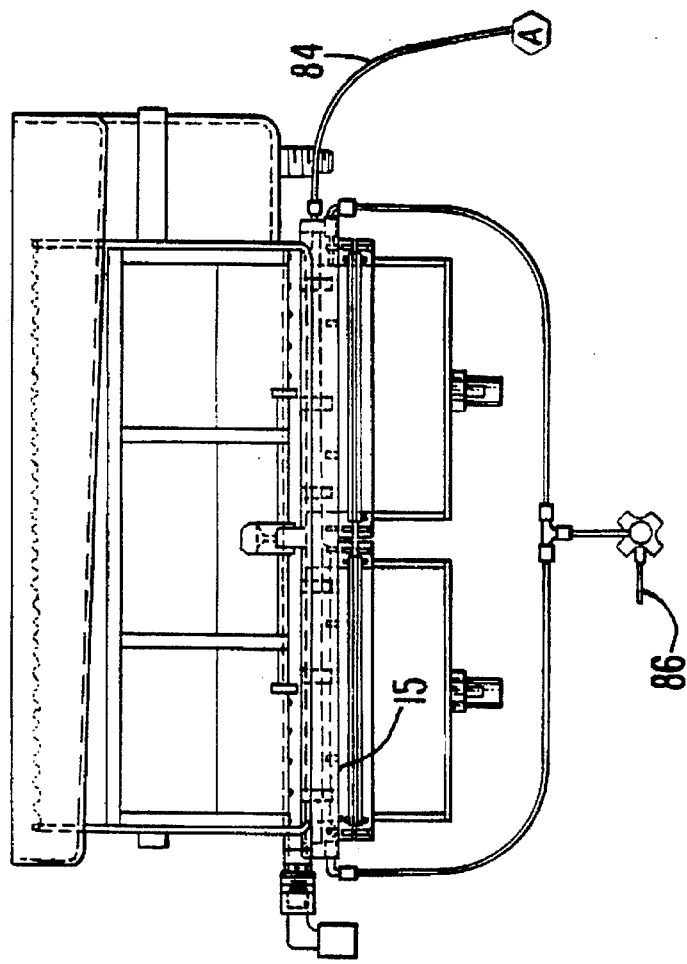
FIG. 7 is a side view of the FIG. 1 megasonic cleaning system showing plumbing used to supply the deionized water layer between the top surface of the impedance matching layer and the bottom surface of the cleaning tank.
Figure 6:
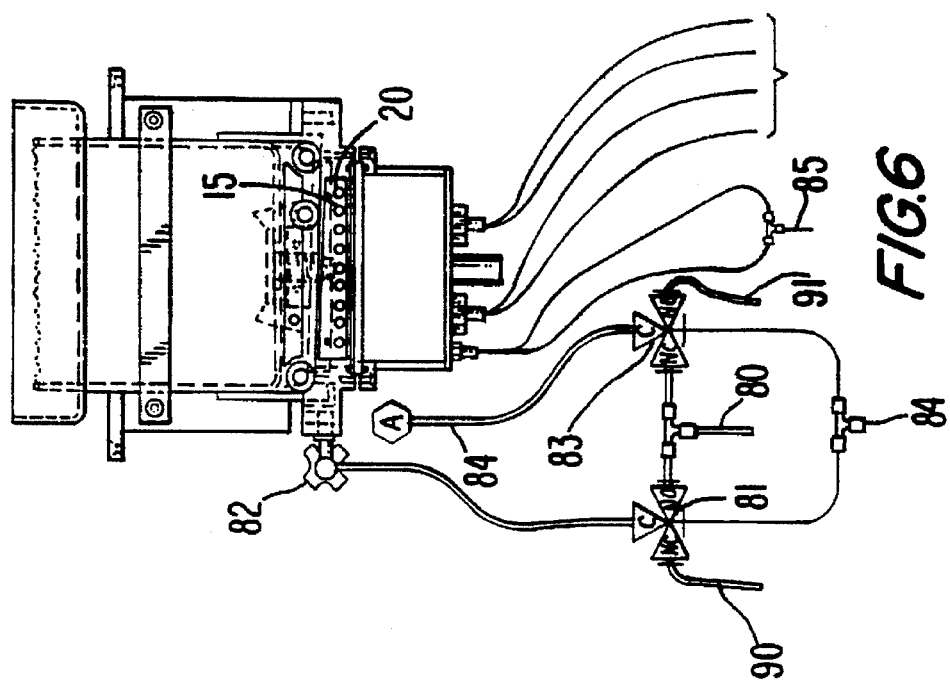
FIG. 6 is an end view of the FIG. 1 megasonic cleaning system showing plumbing used to hydraulically actuate the wiper.

FIGS. 6 and 7 show hydraulic systems utilized to operate the wipers 20 and to provide deionized water to cavity 15. Wipers 20 are connected to a hydraulically operated piston. A deionized water supply 80 provides approximately 30–40 psi of pressure. In a first setting, the pressure passes through the normally open (NO) and common (C) passages of valve 81 to valve 82 and from there it is supplied to one side of the piston pushing the piston and the attached wipers to one side of the unit. In a second setting, valves 81 and 83 are pneumatically actuated, via control line 84, such that the normally open (NO) passage of valve 81 becomes closed and such that the normally closed (NC) passage of valve 83 becomes open. In this way, the pressure is supplied through valve 83 to the opposite side of the piston via line 84. This moves the piston and the attached wipers back to the other side. This operation can be preformed every 10 to fifteen minutes to prevent the excessive build up of bubbles on either the top surface of the matching layer or on the bottom surface of the cleaning tank. Lines 90 and 91 reclaim deionized water.

Also shown in FIG. 6 is purge line 85 which supplies nitrogen, at slightly greater than ambient pressure, to the transducer array box. This keeps the interior of the box dry and prevents electrical contacts from becoming corroded.

Shown in FIG. 7 is another deionized supply line 86 which provides deionized water to cavity 15 via lines 87 and 88. Valve 89 is used to regulate the pressure of deionized water being provided to cavity 15 such that a small amount of water continually seeps out a bit from under tank 10.

Other variations and modifications of the invention will be apparent to those that are skilled in the art without departing from the spirit and the scope of the invention. The above described embodiment is therefore intended to be merely exemplary, and all such variations and modifications are intended to be included within the scope of the invention as defined in the appended claims.

What is claimed is:

1. A megasonic cleaning system for cleaning articles such as semiconductor wafers comprising:

a cleaning tank adapted to hold cleaning liquid and an article to be cleaned in said cleaning liquid;

a transducer for converting electrical energy into acoustical energy, said transducer having at least first and second opposite sides, said transducer mounted outside of, spaced from and with said first side facing said cleaning tank, said transducer having an acoustical impedance greater than that of the cleaning liquid;

a source of oscillating electrical energy electrically coupled to said transducer for driving said transducer to produce said acoustical energy at substantially megasonic frequencies;

an impedance matching layer interposed between said first side of said transducer and said cleaning fluid, said matching layer having an acoustical impedance between that of said transducer and that of said cleaning liquid, said matching layer being coupled to said first side of said transducer, said matching layer and said cleaning tank being acoustically coupled together by an intervening liquid layer and an acoustically matched backing layer not being coupled to said second side of said transducer.

2. A megasonic cleaning system according to claim 1 wherein said transducer, matching layer and intervening liquid layer are positioned below said cleaning tank.

3. A megasonic cleaning system comprising:

a cleaning tank adapted to hold cleaning liquid and an article to be cleaned in said cleaning liquid;

a transducer for converting electrical energy into acoustical energy, said transducer mounted outside of, spaced from and oriented to transmit acoustical energy into said cleaning tank, said transducer having an acoustical impedance greater than that of the cleaning liquid;

a source of oscillating electrical energy electrically coupled to said transducer for driving said transducer to produce said acoustical energy at substantially megasonic frequencies;

an impedance matching layer interposed between said transducer and said cleaning fluid, said matching layer having an acoustical impedance between that of said transducer and that of said cleaning liquid;

said matching layer being coupled to said transducer, said matching layer and said cleaning tank being acoustically coupled together by an intervening liquid layer with said transducer, matching layer and intervening liquid layer being positioned below said cleaning tank;

a wiper positioned in said liquid layer between a bottom surface of said tank and a top surface of said matching layer, said wiper being adapted to periodically wipe bubbles from said top and bottom surfaces.

4. A megasonic cleaning system according to claim 3 wherein said wiper is hydraulically or pneumatically activated.

5. A megasonic cleaning system according to claim 3 wherein the bottom surface of said cleaning tank is angled approximately 2 degrees with respect to level.

6. A megasonic cleaning system according to claim 1 wherein said matching layer has an impedance approximately equal to the geometric mean of the impedances of the transducer and the cleaning fluid.

7. A megasonic cleaning system comprising:

a cleaning tank adapted to hold cleaning liquid and an article to be cleaned in said cleaning liquid;

first and second arrays of transducers for converting electrical energy into acoustical energy, said first and second arrays being adapted to transmit acoustical energy at substantially megasonic frequencies into said cleaning liquid;

a source of electrical energy oscillating at substantially megacycle frequencies for driving said arrays at said substantially megasonic frequencies, said source being coupled to a switch adapted to provide said electrical energy to either said first array or said second array;

a switch controller for commanding said switch to provide said electrical energy alternately to said first and said second arrays.

8. A megasonic cleaning system according to claim 7, further comprising:

a signal detector coupled to said second array, said detector being selectively utilized to receive signals generated by said second array when said switch is providing said electrical energy to said first array.

9. A megasonic cleaning system according to claim 8 further comprising a detector coupled to said first array, said detector being selectively utilized to receive signals generated by said first array when said switch is providing said electrical energy to said second array.

10. A megasonic cleaning system according to claim 7 wherein said switch switches said electrical energy back and forth between said first and second arrays at a rate of approximately 10–20 times per second.

* * * * *